(12) United States Patent
Lof et al.

(10) Patent No.: US 7,253,881 B2
(45) Date of Patent: Aug. 7, 2007

(54) METHODS AND SYSTEMS FOR LITHOGRAPHIC GRAY SCALING

(75) Inventors: Joeri Lof, Eindhoven (NL); Pieter Willem Herman De Jager, Rotterdam (NL); Joannes Theodor De Smit, Eindhoven (NL)

(73) Assignee: ASML Netherlands BV, Veldhoven (NL)

( * ) Notice: Subject to any disclaimer, the term of this patent is extended or adjusted under 35 U.S.C. 154(b) by 253 days.

(21) Appl. No.: 11/024,030

(22) Filed: Dec. 29, 2004

(65) Prior Publication Data

US 2006/0139597 A1    Jun. 29, 2006

(51) Int. Cl.
G03B 27/52 (2006.01)
G03B 27/54 (2006.01)

(52) U.S. Cl. .......................................... 355/55; 355/67
(58) Field of Classification Search ................. 355/53, 355/55, 67–71, 77; 430/311; 359/626
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,504,504 A | 4/1996 | Markandey et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,002,466 A | 12/1999 | Brauch et al. | |
| 6,133,986 A * | 10/2000 | Johnson | 355/67 |
| 6,177,980 B1 | 1/2001 | Johnson | |
| 6,285,488 B1 | 9/2001 | Sandstöm | |
| 6,301,000 B1 | 10/2001 | Johnson | |
| 6,379,867 B1 * | 4/2002 | Mei et al. | 430/296 |
| 6,473,237 B2 | 10/2002 | Mei | |
| 6,498,685 B1 * | 12/2002 | Johnson | 359/626 |
| 6,509,955 B2 | 1/2003 | Mei et al. | |
| 6,687,041 B1 | 2/2004 | Sandstrom | |
| 6,717,650 B2 | 4/2004 | Jain | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,833,854 B1 | 12/2004 | Sandström | |
| 6,833,908 B2 | 12/2004 | Markle | |
| 6,930,755 B2 | 8/2005 | Van Der Mast | |
| 6,967,711 B2 * | 11/2005 | Gui | 355/67 |
| 7,116,404 B2 * | 10/2006 | Lof et al. | 355/67 |

(Continued)

FOREIGN PATENT DOCUMENTS

EP    1 482 375 A2    12/2004

(Continued)

Primary Examiner—Henry Hung Nguyen
(74) Attorney, Agent, or Firm—Sterne, Kessler, Goldstein & Fox, PLLC (57) ABSTRACT

Improved gray scaling imaging methods and systems include a group of elements within an array of individually controllable elements that project a part of a radiation beam onto a lens in an array of microlenses, and are individually controllable so that any number of the individually controllable elements may be switched on or off to generate a gray scale.

20 Claims, 6 Drawing Sheets

U.S. PATENT DOCUMENTS

| | | |
|---|---|---|
| 7,133,118 B2 | 11/2006 | Gui et al. |
| 2004/0041104 A1 | 3/2004 | Liebregts et al. |
| 2004/0130561 A1 | 7/2004 | Jain |
| 2005/0007572 A1 | 1/2005 | George et al. |

FOREIGN PATENT DOCUMENTS

| | | |
|---|---|---|
| WO | WO 98/33096 | 7/1998 |
| WO | WO 98/38597 | 9/1998 |

* cited by examiner

METHODS AND SYSTEMS FOR LITHOGRAPHIC GRAY SCALING

BACKGROUND OF THE INVENTION

1. Field of the Invention

The present invention relates to a lithographic apparatus and a method for manufacturing a device.

2. Related Art

A lithographic apparatus is a machine that applies a desired pattern onto a target portion of a substrate (e.g., a workpiece, an object, a display, etc.). The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means can comprise an array of individually controllable elements that generate the circuit pattern. This is referred to as maskless lithography.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

Another way of imaging includes pixel grid imaging, in which a pattern is realized by successive exposure of spots.

It is also possible to transfer the pattern from the patterning device to the substrate by imprinting the pattern onto the substrate. Instead of a mask, the patterning device may comprise a patterning array that comprises an array of individually controllable elements. An advantage of such a system compared to a mask-based system is that the pattern can be changed more quickly and for less cost.

Many patterning devices are binary, that is the dose delivered to a given point on the substrate can be one of two kinds, a high level or a low level. Normally the high level is set at a level that will expose the resist, i.e., is above the resist threshold, whereas the low level is below the resist threshold and does not expose the resist.

Gray scaling is, however, only directly achievable with some patterning devices, for example those which operate as a grating light valve. These devices only have a limited number of pixels, reducing their usefulness. For other devices, a gray scale can be obtained by switching an individually controllable element on and off at a controlled rate. This has the disadvantage that it decreases the throughput at which the apparatus can operate.

What are needed, therefore, are improved gray scaling imaging methods and systems.

BRIEF SUMMARY OF THE INVENTION

The present invention is directed to improved gray scaling imaging methods and systems. In accordance with an embodiment of the invention, a group of elements within an array of individually controllable elements project a part of a radiation beam onto a lens in an array of microlenses, and are individually controllable so that any number of the individually controllable elements may be switched on or off to generate a gray scale.

According to an aspect of the invention, lithographic apparatus includes an illumination system that conditions a radiation beam, an array of individually controllable elements that modulates a cross-section of the radiation beam, a substrate table that supports a substrate, and a projection system that projects the modulated radiation beam onto a target portion of the substrate. The projection system includes an array of focusing elements arranged in a plane such that each focusing element transmits a different part of the radiation beam onto a spot on the substrate. Elements within a group of the individually controllable elements are controlled to selectively direct a part of the radiation beam through a focusing element in the array of focusing elements, thereby providing gray scaling.

According to a further aspect of the invention, there is provided a method including providing a substrate, providing a radiation beam using an illumination system, using an array of individually controllable elements to modulate a cross section of the radiation beam, and providing an array of focusing elements arranged in a plane such that each focusing element transmits a different part of the radiation beam onto a spot on the substrate. A group of the individually controllable elements are controlled to selectively direct a part of the radiation beam onto a single focusing element in the array of focusing elements, and the modulated beam of radiation is projected onto a target portion of the substrate. The selection of individually controllable elements in the group used to direct part of the radiation beam through the single focusing element is controlled to provide gray scaling to the substrate.

According to a further aspect of the invention, there is provided a method including receiving a beam of radiation at an array of individually controllable elements, directing portions of the beam of radiation from corresponding groups of the individually controllable elements to a substrate through corresponding focusing elements, and selectively controlling elements within the groups of the individually controllable elements to provide gray scaling to the substrate.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Embodiments of the invention will now be described, by way of example, with reference to the accompanying drawing figures in which corresponding reference symbols indicate corresponding parts.

DETAILED DESCRIPTION OF THE INVENTION

Overview and Terminology

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the filter can filter out the diffracted light, leaving the undiffracted light to reach the substrate. In this manner, the beam becomes patterned according to the addressing pattern of the matrix-addressable surface. It will be appreciated that, as an alternative, the undiffracted light can be filtered out of the reflected beam, leaving only the diffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. A programmable LCD array can also be used. It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g., having a wavelength of 365, 355, 248, 193, 157 or 126 nm) and extreme ultra-violet (EUV) radiation (e.g., having a wavelength in the range of 5-20 nm), as well as particle beams, such as ion beams or electron beams.

The projection system may image the pattern on the array of individually controllable elements such that the pattern is coherently formed on the substrate. Alternatively, the projection system may image secondary sources for which the elements of the array of individually controllable elements act as shutters. In this respect, the projection system may include an array of focusing elements such as a micro lens array (known as an MLA) or a Fresnel lens array, e.g., to form the secondary sources and to image spots onto the substrate. This is described and illustrated below. In such an arrangement, each of the focusing elements in the array of focusing elements may be associated with one of the individually controllable elements in the array of individually controllable elements. Alternatively, the projection system may be configured such that radiation from a plurality of the individually controllable elements in the array of individually controllable elements is directed to one of the focusing elements in the array of focusing elements and from there onto the substrate.

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Exemplary Lithographic Projection Tools

Figure 1:
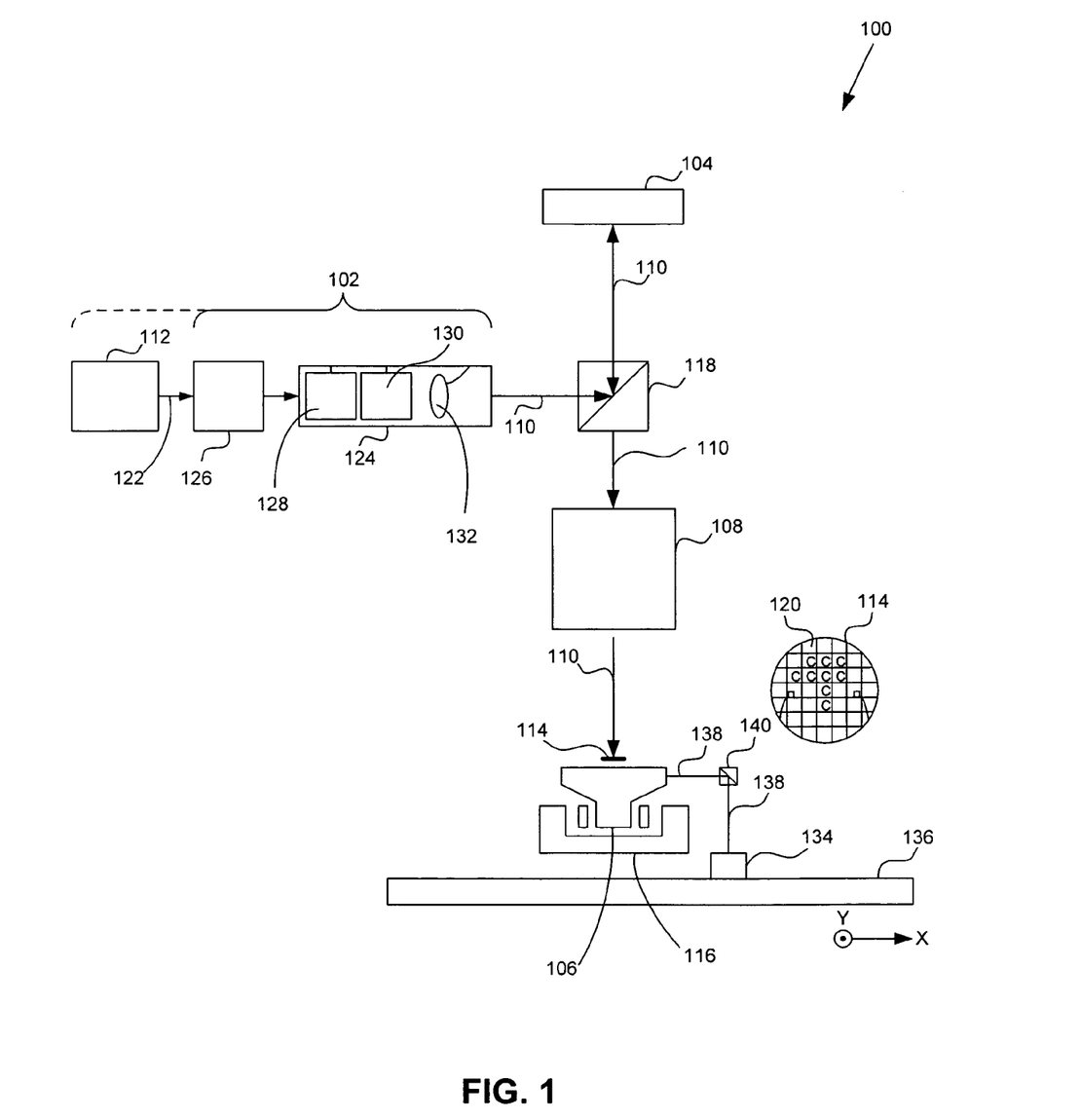
FIG. 1 is a block diagram of a lithographic apparatus.

FIG. 1 is a block diagram of an example lithographic projection apparatus 100, including a radiation system 102, an array of individually controllable elements 104, an object table 106 (e.g., a substrate table), and a projection system ("lens") 108. Radiation system 102 provides a beam 110 of radiation (e.g., UV radiation) from a radiation source 112.

An array of individually controllable elements 104 (e.g., a programmable mirror array) applies a pattern to beam 110. The position of the array of individually controllable elements 104 can be fixed relative to projection system 108. Alternatively, the array of individually controllable elements 104 is connected to a positioning device (not shown) for positioning array of individually controllable elements 104 with respect to projection system 108. As here depicted, individually controllable elements 104 are of a reflective type (e.g., have a reflective array of individually controllable elements). Alternatively, the apparatus can be of a transmissive type (e.g., employing a transmissive array of individually controllable elements).

Object table 106 is optionally provided with a substrate holder (not shown) for holding a substrate 114 (e.g., a resist coated silicon wafer or glass substrate). Object table 106 is optionally connected to a positioning device 116 for positioning substrate 114 with respect to projection system 108.

Projection system 108 (e.g., a quartz and/or $CaF_2$ lens system or a catadioptric system comprising lens elements made from such materials, or a mirror system) projects the patterned beam received from a beam splitter 118 onto a target portion 120 (e.g., one or more dies) of substrate 114. Projection system 108 can project an image of the array of individually controllable elements 104 onto substrate 114. Alternatively, projection system 108 projects images of secondary sources for which the elements of the array of individually controllable elements 104 act as shutters. Projection system 108 can include a micro lens array (MLA) to form the secondary sources and to project microspots onto substrate 114, as is discussed in more detail below.

Source 112 (e.g., a frequency tripled Nd:YAG laser) produces a beam of radiation 122, which is provided to an illumination system (illuminator) 124, either directly or after having traversed conditioning device 126, such as a beam expander, for example. Illuminator 124 can include an adjusting device 128 for setting a zoom to adjust a spot size of beam 122. In addition, illuminator 124 will generally include various other components, such as spot generator 130 and a condenser 132. For example, spot generator 130 can be, but is not limited to, a refractive or diffractive grating, segmented mirror arrays, waveguides, or the like. In this way, beam 110 impinging on the array of individually controllable elements 104 has a desired zoom, spot size, uniformity, and intensity distribution in its cross section.

It should be noted, with regard to FIG. 1, that source 112 can be within the housing of lithographic projection apparatus 100. In alternative embodiments, source 112 is remote from lithographic projection apparatus 100. In the latter case, radiation beam 122 is directed into apparatus 100, optionally with the aid of suitable directing mirrors. It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116, and optionally interferometric measuring device 134 on a base plate 136 that receives interferometric beams 138 via beam splitter 140, substrate table 106 can be moved so as to position different target portions 120 in the path of beam 110. Where used, the positioning device for the array of individually controllable elements 104 can be used to correct the position of the array of individually controllable elements 104 with respect to the path of beam 110, such as during a scan. In general, movement of object table 106 is realized with the aid of a long-stroke module (course positioning) and a short-stroke module (fine positioning). A similar system can also be used to position the array of individually controllable elements 104. Alternatively, or additionally, beam 110 can be moveable, while object table 106 and/or the array of individually controllable elements 104 can have a fixed position to provide the required relative movement.

In an alternative configuration, substrate table 106 is fixed, with substrate 114 being moveable over substrate table 106. In this configuration, substrate table 106 is provided with a multitude of openings on a flat uppermost surface, with gas being fed through the openings to provide a gas cushion that is capable of supporting substrate 114. This is conventionally referred to as an air bearing arrangement. Substrate 114 is moved over substrate table 106 using one or more actuators, which are capable of positioning substrate 114 with respect to the path of beam 110. Alternatively, substrate 114 is moved over substrate table 106 by selectively starting and stopping the passage of gas through the openings.

Figure 2:
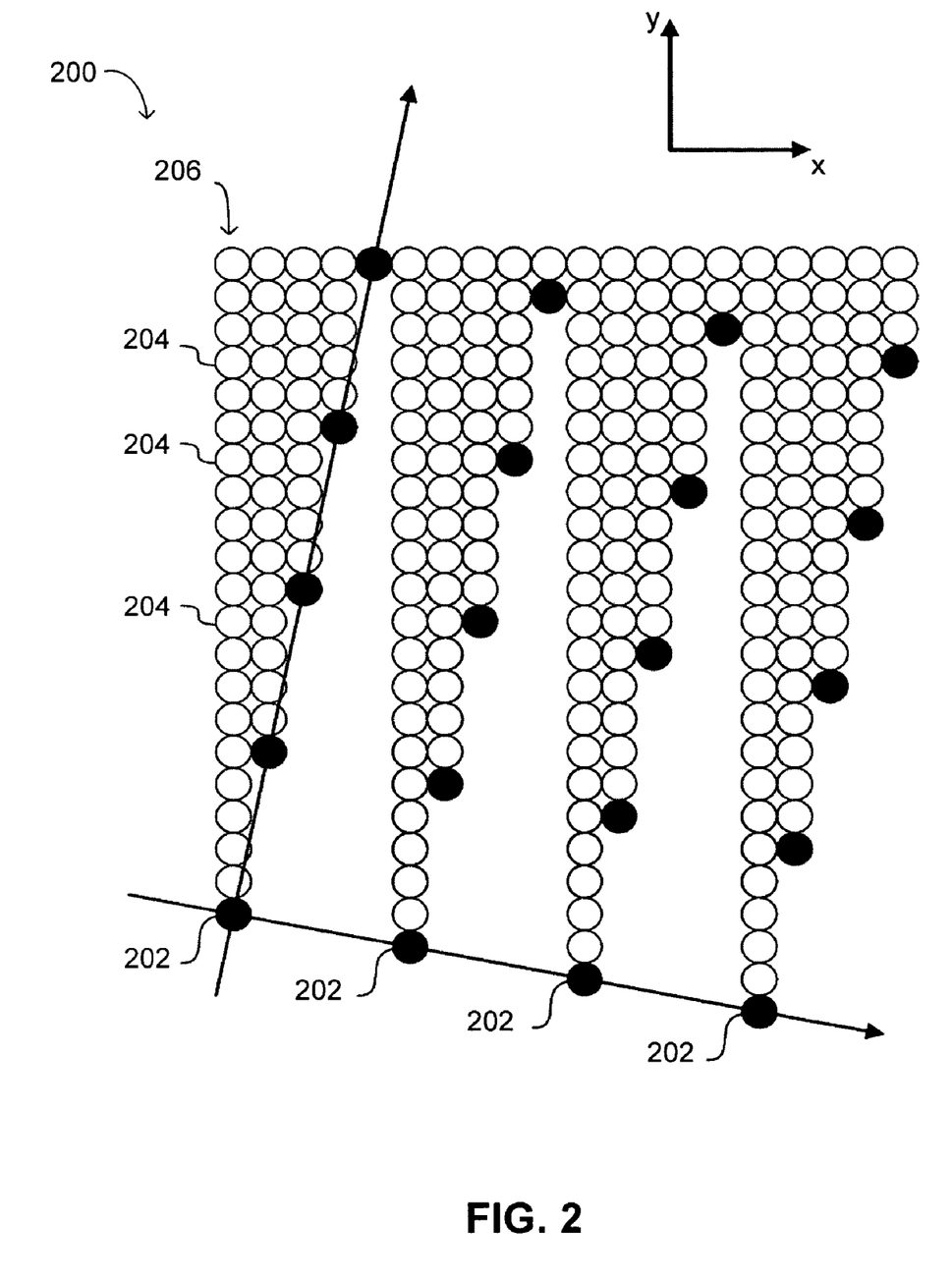
FIG. 2 illustrates a pattern provided to a substrate.

Although lithography apparatus 100 is described herein as being for exposing a resist on a substrate, it will be appreciated that the invention is not limited to this use and apparatus 100 can be used to project a patterned beam 110 for use in resistless lithography.

Where the projection system includes an array of focusing elements that images an array of spots on the substrate 114, the pattern formed on the substrate 114 may not directly correspond to the pattern formed on the array of individually controllable elements at a single instant. FIG. 2 illustrates a pattern 200 provided to a substrate by the lithographic projection apparatus 100. The filled-in circles represent an array of spots 202 projected onto the substrate by the array of focusing elements in the projection system 108 of lithographic projection apparatus 100. The substrate is moved relative to the projection system in the Y direction as a series of exposures are exposed on the substrate. The open circles represent spot exposures 204 that have previously been exposed on the substrate. As shown, each spot projected onto the substrate by the array of focusing elements within the projection system 108 exposes a row of spot exposures on the substrate. The complete pattern for the substrate is generated by the sum of all the rows 206 of spot exposures 204 exposed by each of the spots 202. Such an arrangement is commonly referred to as "pixel grid imaging".

The lithographic projection apparatus 100 can be used in at least the following modes.

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

5. Pixel Grid Imaging Mode: the pattern formed on substrate 114 is realized by subsequent exposure of spots formed by spot generator 130 that are directed onto array 104. The exposed spots have substantially a same shape. On substrate 114 the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

Exemplary Gray Scaling Systems and Methods

Figure 3:
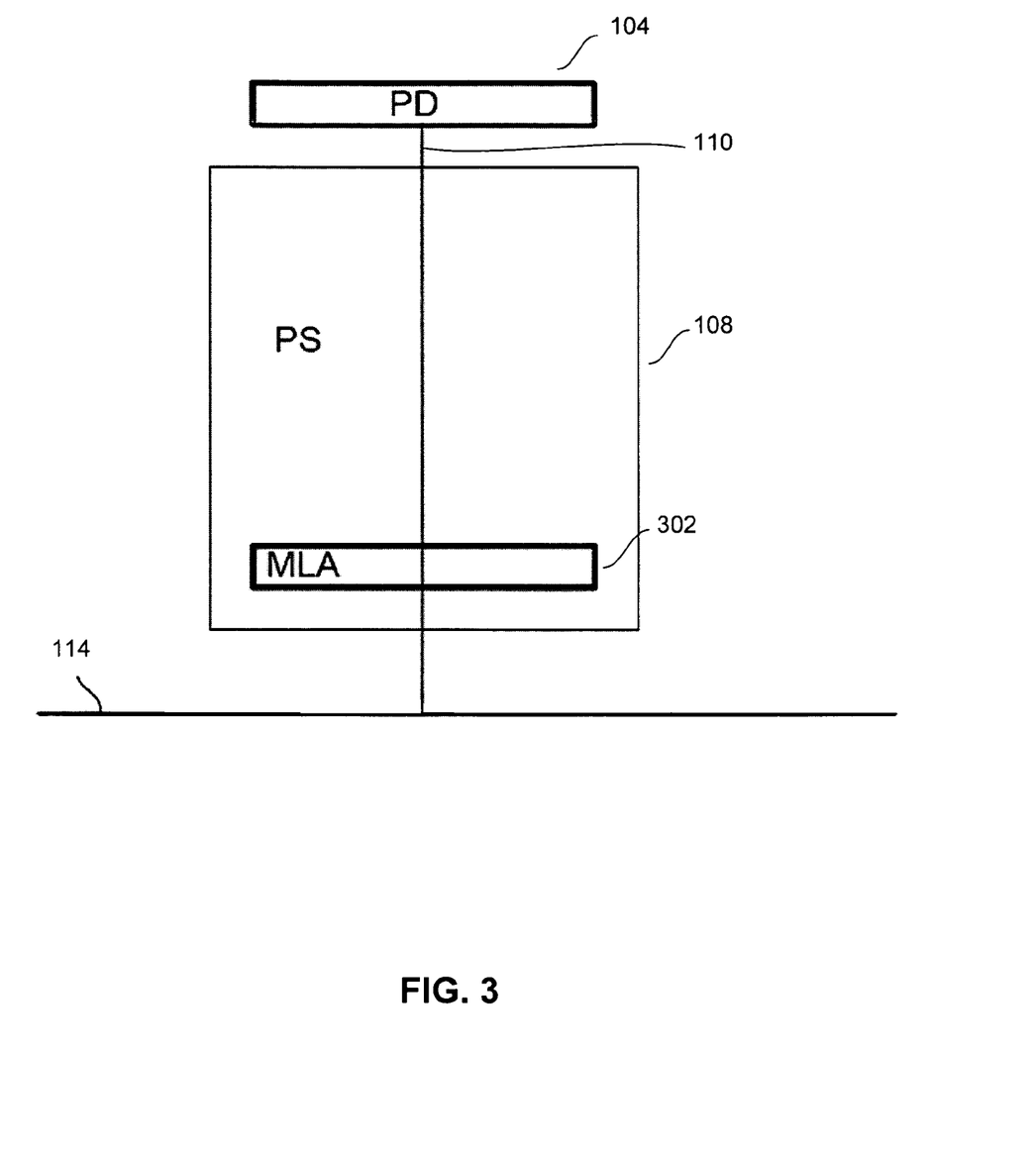
FIG. 3 is a block diagram of a radiation beam projected from an array of individually controllable elements, through a microlens array, and onto a substrate.
Figure 4:
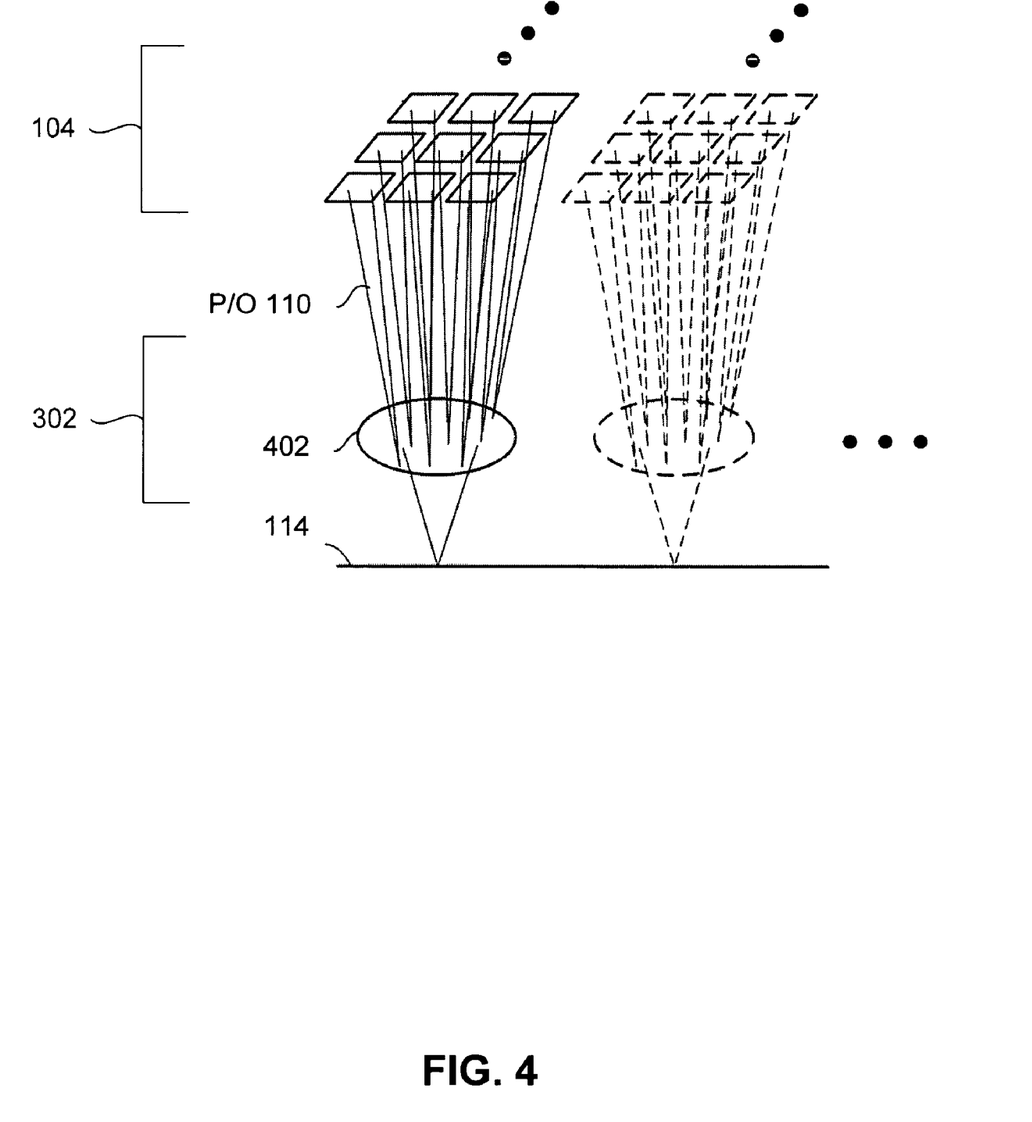
FIG. 4 is a block diagram of the radiation beam between the individually controllable elements and the microlens array.

FIG. 3 is a block diagram of radiation beam 110 projected from array of individually controllable elements 104, through a microlens array 302 within projection system 108, and onto substrate 114. FIG. 4 is a more detailed block diagram of radiation beam 110, individually controllable elements 104, and microlens array 302.

Figure 5A:
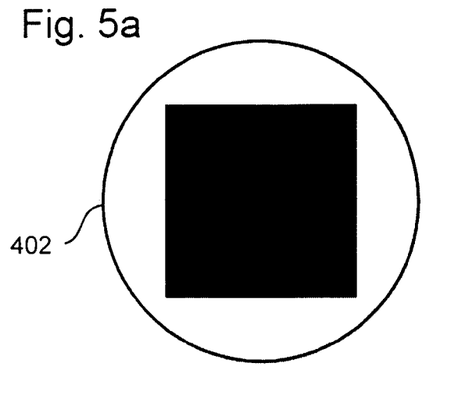
FIGS. 5a to 5f show a non-exhaustive series of gray scale patterns.
Figure 5B:
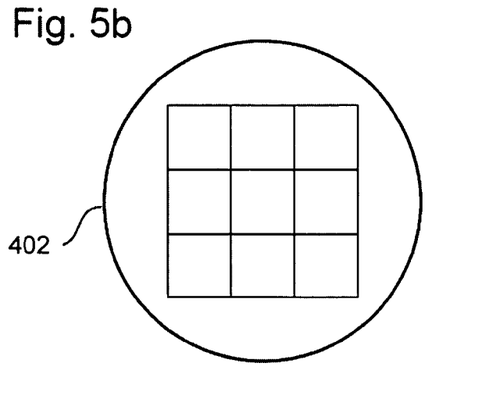
Figure 5C:
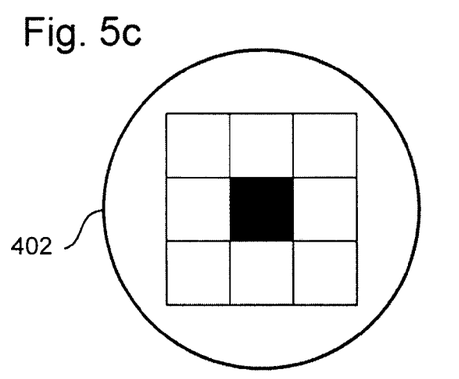
Figure 5D:
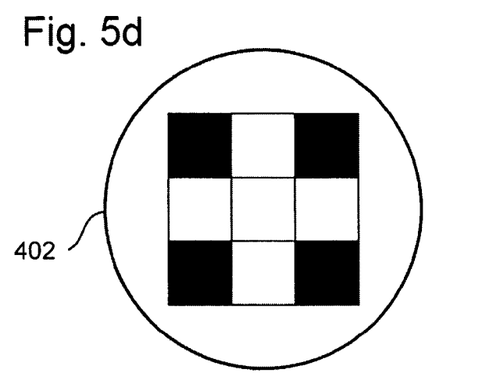

In the example of FIG. 4, a group of nine individually controllable elements 104 are arranged to project a part of the radiation beam 110 onto a single lens 402 in the microlens array 302. By adjusting the number of individually controllable elements 402 switched "on" (i.e., projecting the radiation beam towards the single lens 402) in the group of nine individually controllable elements 104, the resulting degree of exposure of the substrate 114 can be controlled. For example, all the individually controllable elements 104 in the group could be switched "on" resulting in an area of substrate completely exposed, as shown in FIG. 5a. Alternatively, all nine individually controllable elements 104 could be switched "off" resulting in an unexposed area of the substrate 114, as shown in FIG. 5b. In FIG. 5c, one of the individually controllable elements 104 are switched "on", resulting in a partially exposed area. A further example is that four of the nine individually controllable elements switched "on" as shown in FIG. 5d result in a partially exposed area. As more pixels are switched "on" in FIG. 5d the area will be more exposed than the example shown in FIG. 5c.

Additional gray scaling techniques are taught in U.S. patent applcation. Ser. No. 10/779,811, filed Feb. 18, 2004 (now U.S. Pat. No. 7,133,118 B2, granted Nov. 7, 2006), which is incorporated herein by reference in its entirety.

By adjusting the number of pixels in the group which are switched "on" it is possible to obtain a variation in the degree of exposure, which provides a relatively large number of gray scales. Although a group of nine individually controllable elements 104 are shown in FIGS. 4 and 5, any number of individually controllable elements 104 can be used to form a group projecting onto a single lens 402. In an embodiment, individually controllable elements 104 are grouped in squares, such as 2×2, 3×3, 4×4 etc. The invention is not, however, limited to groupings of squares. In an embodiment, symmetrical patterns of pixels are switched "on" as shown in FIGS. 5a to 5d. This helps to reduce optical distortions. The invention is not, however, limited to switching pixels on symmetrically.

This invention can be implemented in conjunction with an array of individually controllable elements 104 formed by a dynamic mirror device. The high contrast generated between the "on" and "off" states of a given pixel have been found to be particularly suitable to this type of application. Furthermore, dynamic mirror devices have a high density of pixels so are particularly suited to this. Dynamic mirror devices are relatively inexpensive, standard components that are suitable for mass production. Thus, it is relatively easy to obtain a large range of gray scales with relatively standard components.

It has been determined that when a reduced number of pixels is projected through a lens, the numerical aperture NA may be reduced, leading to an increase in spot size. Furthermore, non-symmetrical illumination of individual lenses 402 can cause focusing problems. These features can be accommodated in a variety of ways.

For example, and without limitation, the size of the spot is optionally controlled by arranging the system that generates each spot on the substrate such that the numerical aperture is greater than a predetermined level when a minimum number of pixels are switched on.

Alternatively, or additionally, a controller is provided to control which individually controllable elements 104 are used to direct the radiation beam 110 onto a single lens 402. The numerical aperture may thus be controlled by arrangement of the structural components, for example the projection system etc., or by controlling which individually controllable elements are used to direct the radiation beam 110 onto a single lens 402. For example, maximizing the total area of the single lens used will increase the numerical aperture and thus decrease the spot size. The controller can control the individually controllable elements to maximize an exposure moment. An exposure moment can be defined as the area of a focusing element (i.e., lens) traversed by the radiation beam. Alternatively, an exposure moment can be defined as the area of the focusing element traversed by the radiation beam, multiplied by the distance from the center of the focusing element summed over the focusing element.

Methods and systems for insuring proper operation include, without limitation:

1) Increase the NA of the projection system above a minimum i.e., ensure that the apparatus operates with just one of the group of pixels switched "on".

2) Selecting a combination of pixels switched "on" to optimize resolution. Using the pixels towards the outside of the group has been found to improve the resolution as this maximizes the total area of the lens 402 used and thus decreases the spot size. In particular, the distance between pixels switched "on" should be maximized. For example, in FIG. 5*d* the corner pixels are switched "on" rather than the pixels in the middle of the edges of the group. This maximizes the area of the lens used.

Figure 6:
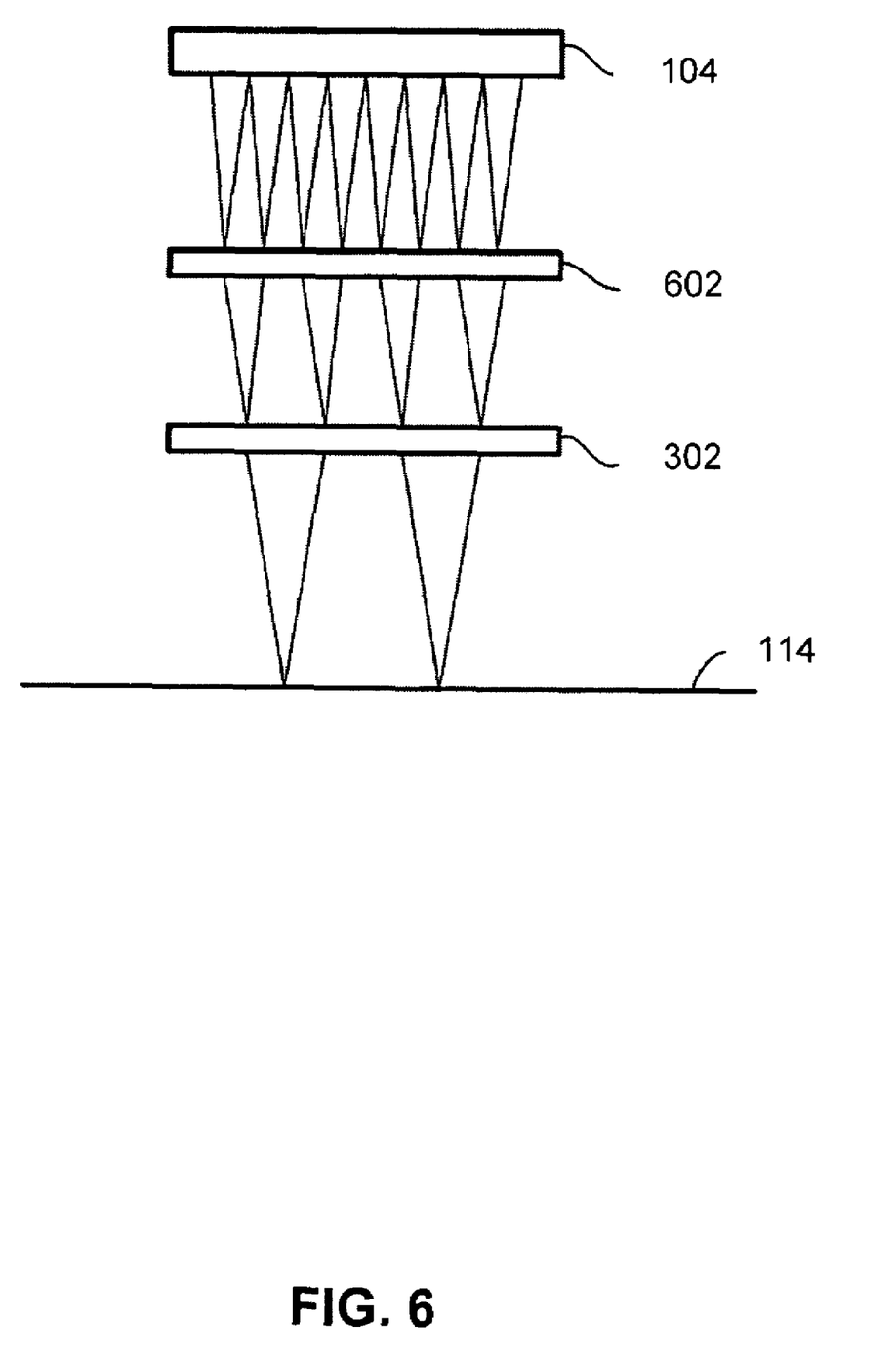
FIG. 6 is a block diagram of a radiation beam projected from an array of individually controllable elements, through multiple microlens arrays, and onto a substrate.

3) A diffusor can be placed between the array of individually controllable elements 104 and the microlens array 302 to increase the size of the illuminated area. Again, this increases the total area of the lens 402 used and thus decreases the spot size. Alternatively a quartz rod or a Flies eye lens could be used. A further alternative would be to introduce an additional microlens array 602 as shown in FIG. 6.

4) The use of a dynamic mirror device also helps to reduce this problem as the increased contrast compensates for the decreased resolution. In general devices that can produce gray scale have less contrast then devices that cannot produce gray scale. The increased contrast of the dynamic mirror device reduces the resolution requirement.

Figure 5E:
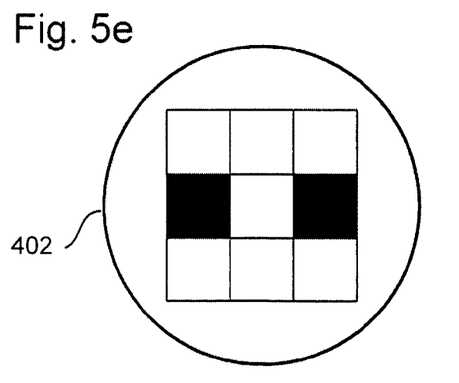
Figure 5F:
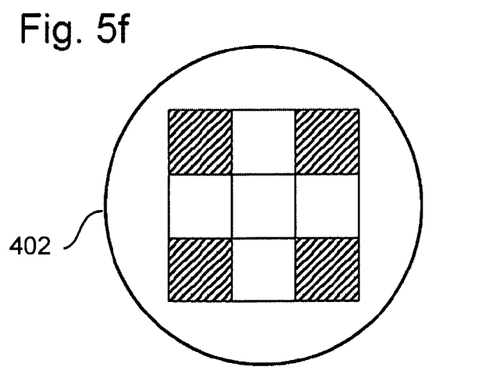

5) The pixels can be switched "on" and "off" during exposure of a single spot. For example, if a gray scale equivalent to switching two pixels "on" is required, as shown in FIG. 5*e* this could be achieved by switching the corner pixels on for 50% of the time each, as shown in FIG. 5*f*. This maximizes the area of the lens used and thus decreases the spot size. This effect can also be used to create a larger range of gray scales.

Although the microlens array 302 is here described as forming part of the projection system 108, it could equally well be a separate unit.

CONCLUSION

While various embodiments of the present invention have been described above, it should be understood that they have been presented by way of example only, and not limitation.

It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

While specific embodiments of the invention have been described above, it will be appreciated that the invention may be practiced otherwise than as described. For example, the invention, or portions thereof, may take the form of a computer program containing one or more sequences of machine-readable instructions describing a method as disclosed above, or a data storage medium (e.g., semiconductor memory, magnetic or optical disk) having such a computer program stored therein.

It is to be appreciated that the Detailed Description section, and not the Summary and Abstract sections, is intended to be used to interpret the claims. The Summary and Abstract sections may set forth one or more, but not all, exemplary embodiments of the present invention as contemplated by the inventor(s), and thus, are not intended to limit the present invention and the appended claims in any way.

What is claimed is:

1. A lithographic apparatus comprising:
an illumination system that conditions a radiation beam;
an array of individually controllable elements that modulates a cross-section of the radiation beam;
a substrate table that supports a substrate;
a projection system that projects the modulated radiation beam onto a target portion of the substrate, the projection system including an array of focusing elements arranged in a plane such that each focusing element transmits a different part of the radiation beam onto a spot on the substrate; and
a controller that controls elements within a group of a plurality of the individually controllable elements to direct part of the modulated radiation beam through a respective focusing element in the array of focusing elements, such that an exposure moment of the focusing element is maximized, wherein the exposure moment is defined by one of (a) the area of the focusing element traversed by the radiation beam, and (b) the area of the focusing element traversed by the radiation beam multiplied by the distance from the center of the focusing element summed over the focusing element.

2. The lithographic apparatus according to claim 1, further comprising a modifying element arranged between the array of individually controllable elements and the array of focusing elements in the path of the radiation beam, the modifying element increasing the area of the focusing element through which part of the radiation beam is selectively directed by one individually controllable element.

3. The lithographic apparatus according to claim 2, wherein the modifying element increases the area through which part of the radiation beam is directed for each of the focusing elements in the array of focusing elements.

4. The lithographic apparatus according to claim 2, wherein the modifying element comprises a common modifying element for all focusing elements.

5. The lithographic apparatus according to claim 2, wherein the modifying element comprises a diffusor.

6. The lithographic apparatus according to claim 2, wherein the modifying element comprises a second array of focusing elements arranged in a plane such that each focusing element transmits a different part of the radiation beam.

7. The lithographic apparatus according to claim 2, wherein the modifying element comprises at least one of a quartz rod and a Flies eye lens.

8. The lithographic apparatus according to claim 2, wherein the modifying element increases the numerical aperture of the projection system.

9. A lithographic method, comprising:
   outputting a radiation beam using an illumination system;
   modulating a cross section of the radiation beam using an array of individually controllable elements;
   providing an array of focusing elements arranged in a plane such that each focusing element transmits a different part of the radiation beam onto a spot on a substrate, a group of a plurality of the individually controllable elements selectively directing a part of the modulated radiation beam onto a single focusing element in the array of focusing elements;
   controlling the group of the plurality of individually controllable elements used to direct part of the modulated radiation beam through the single focusing element to maximize an exposure moment of the single focusing element, wherein the exposure moment of the single focusing element is defined by one of (a) the area of the single focusing element traversed by the radiation beam, and (b) the area of the single focusing element traversed by the radiation beam multiplied by the distance from the center of the single focusing element summed over the single focusing element; and
   projecting the modulated beam of radiation onto a target portion of the substrate.

10. The lithography method according to claim 9, further comprising maximizing the area of the single focusing element traversed by the radiation beam.

11. The lithography method according to claim 10, further comprising changing the modulation of the radiation beam by a single controllable element during the exposure of a point on the substrate.

12. The lithography method according to claim 11, wherein for a given exposure dose over a given period of time a number of individually controllable elements in the group are used to direct the radiation beam through the single focusing element for a fraction of the period of time, the number of individually controllable elements being used being larger than equivalent number used for the whole of the period for the same exposure dose.

13. The lithography method according to claim 12, further comprising maximizing the distance between the individually controllable elements in the group directing the radiation beam through the single focusing element.

14. The lithography method according to claim 9, further comprising maximizing the distance between the individually controllable elements in the group directing the radiation beam through the single focusing element.

15. The lithography method according to claim 9, wherein each group of controllable elements projecting onto an individual focusing element is controlled to direct a pattern through the individual focusing element that is symmetrical.

16. The lithographic method according to claim 9, further comprising increasing the area of the single focusing element through which part of the radiation beam is directed using an additional modifying element arranged between the array of individually controllable elements and the array of focusing elements in the path of the radiation beam.

17. A lithographic method, comprising:
   receiving a beam of radiation at an array of individually controllable elements;
   directing portions of the beam of radiation from corresponding groups of the individually controllable elements to a substrate through corresponding focusing elements; and
   selectively controlling elements within the groups of a plurality of the individually controllable elements to maximize an exposure moment of each corresponding focusing element, wherein the exposure moment of a particular corresponding focusing element is defined by one of (a) the area of the particular focusing element traversed by the beam of radiation, and (b) the area of the particular focusing element traversed by the beam of radiation multiplied by the distance from the center of the particular focusing element summed over the particular focusing element.

18. The lithographic method according to claim 17, further comprising selectively controlling at least one of (a) elements within the groups of the individually controllable elements to provide a desired spot size, (b) elements within the groups of the individually controllable elements to provide a desired numerical aperture, (c) elements within the groups of the individually controllable elements to switch on symmetrically, (d) elements within the groups of the individually controllable elements to maximize an illuminated portion of a corresponding focusing element, and (e) elements within the groups of the individually controllable elements to provide gray scaling to the substrate.

19. The lithographic apparatus according to claim 1, wherein the controller controls elements within the group of the plurality of the individually controllable elements to provide gray scaling to the substrate.

20. The lithography method according to claim 9, further comprising controlling the group of the plurality of individually controllable elements to provide gray scaling to the substrate.

* * * * *